(12) United States Patent
Huang

(10) Patent No.: US 11,349,044 B2
(45) Date of Patent: May 31, 2022

(54) PHOTODETECTION FILM, PHOTODETECTION SENSOR AND PHOTODETECTION DISPLAY APPARATUS INCLUDING THE PHOTODETECTION FILM, AND METHOD OF MAKING THE PHOTODETECTION FILM

(71) Applicant: SHANGHAI HARVEST INTELLIGENCE TECHNOLOGY CO., LTD., Shanghai (CN)

(72) Inventor: Jiandong Huang, Shanghai (CN)

(73) Assignee: SHANGHAI HARVEST INTELLIGENCE TECHNOLOGY CO., LTD., Shanghai (CN)

( * ) Notice: Subject to any disclaimer, the term of this patent is extended or adjusted under 35 U.S.C. 154(b) by 140 days.

(21) Appl. No.: 16/635,150

(22) PCT Filed: Jul. 27, 2018

(86) PCT No.: PCT/CN2018/097356
§ 371 (c)(1),
(2) Date: Jan. 29, 2020

(87) PCT Pub. No.: WO2019/024773
PCT Pub. Date: Feb. 7, 2019

(65) Prior Publication Data
US 2020/0388719 A1    Dec. 10, 2020

(30) Foreign Application Priority Data
Jul. 31, 2017 (CN) .......................... 201710640248.8

(51) Int. Cl.
*H01L 31/112* (2006.01)
*H01L 31/20* (2006.01)
(Continued)

(52) U.S. Cl.
CPC ...... *H01L 31/202* (2013.01); *H01L 27/14612* (2013.01); *H01L 27/14627* (2013.01);
(Continued)

(58) Field of Classification Search
CPC ................. H01L 31/202; H01L 31/113; H01L 27/14612; H01L 27/14627;
(Continued)

(56) References Cited

U.S. PATENT DOCUMENTS 7,659,594 B1 * 2/2010 Liou .................... H01L 31/1136
257/448
8,207,528 B2 * 6/2012 Yutani ................. H01L 51/0015
257/40
(Continued)

FOREIGN PATENT DOCUMENTS

CN    103762251 B  *  3/2016
CN    105552131 A  *  5/2016
(Continued)

OTHER PUBLICATIONS

Search Report issued to PCT application No. PCT/CN2018/097356 by the CNIPA dated Nov. 1, 2018.
(Continued)

*Primary Examiner* — Earl N Taylor
(74) *Attorney, Agent, or Firm* — Womble Bond Dickinson (US) LLP

(57) ABSTRACT

A photodetection film includes a photodetection transistor. The photodetection transistor includes a gate electrode, a gate insulating layer surroundingly formed on the gate electrode, at least one drain terminal disposed on the gate insulating layer and is spaced apart from the gate electrode, at least one source terminal disposed on the gate insulating layer and is spaced apart from the gate electrode and the at least one drain terminal, and a light-absorbing semiconduc-
(Continued)

tor layer disposed on the gate insulating layer and extends between the drain and source terminals. A photodetection sensor, a photodetection display apparatus, and a method of making the photodetection film are also disclosed.

26 Claims, 10 Drawing Sheets

(51) Int. Cl.
H01L 27/146 (2006.01)
H01L 31/113 (2006.01)

(52) U.S. Cl.
CPC .. *H01L 27/14685* (2013.01); *H01L 27/14692* (2013.01); *H01L 31/113* (2013.01); *H01L 31/1136* (2013.01); *H01L 31/208* (2013.01); H01L 27/14643 (2013.01)

(58) Field of Classification Search
CPC ......... H01L 27/14685; H01L 27/14692; H01L 31/208; H01L 27/14643; H01L 27/1222; H01L 31/112; H01L 31/02161; H01L 31/0224; H01L 27/1214; H01L 31/1136; H01L 31/1804; H01L 31/204; Y02E 10/547
See application file for complete search history.

(56) References Cited

U.S. PATENT DOCUMENTS

| | | | | |
|---|---|---|---|---|
| 9,698,193 B1 * | 7/2017 | Karim | .................. | G01T 1/241 |
| 11,056,608 B2 * | 7/2021 | Huang | .................. | H01L 31/18 |
| 11,060,922 B2 * | 7/2021 | Altenbeck | ............. | G01J 5/0878 |
| 2007/0145284 A1 * | 6/2007 | Klausmann | ........... | G01T 1/2018 |
| | | | | 250/370.11 |
| 2007/0257256 A1 * | 11/2007 | Kugler | .................. | B82Y 10/00 |
| | | | | 257/40 |
| 2009/0201042 A1 * | 8/2009 | Sellathamby | ....... | H01L 27/1214 |
| | | | | 324/754.29 |
| 2010/0193775 A1 * | 8/2010 | Yutani | ................ | H01L 51/0015 |
| | | | | 257/40 |
| 2011/0217811 A1 * | 9/2011 | Tanaka | .............. | H01L 21/02595 |
| | | | | 438/97 |
| 2016/0035783 A1 * | 2/2016 | Dixon | ................. | H01L 31/1844 |
| | | | | 257/184 |
| 2016/0172527 A1 * | 6/2016 | Beechem, III | ...... | H01L 31/0232 |
| | | | | 257/294 |
| 2018/0129043 A1 * | 5/2018 | Kim | ..................... | G02B 27/01 |
| 2020/0227448 A1 * | 7/2020 | Tseng | ................. | H01L 27/1461 |
| 2020/0229709 A1 * | 7/2020 | Huang | ................. | A61B 5/4872 |
| 2020/0295077 A1 * | 9/2020 | Huang | ................. | H01L 31/101 |
| 2020/0321384 A1 * | 10/2020 | Huang | ................. | H01L 27/3234 |
| 2020/0388719 A1 * | 12/2020 | Huang | ................. | H01L 31/113 |
| 2020/0395498 A1 * | 12/2020 | Huang | ................. | H01L 31/1804 |
| 2021/0192169 A1 * | 6/2021 | Huang | ................. | G06F 3/04166 |

FOREIGN PATENT DOCUMENTS

| | | | |
|---|---|---|---|
| JP | H1140841 A | * | 2/1999 |
| TW | 200937627 A | | 9/2009 |
| TW | 201039444 A | | 11/2010 |
| TW | 201140395 A | | 11/2011 |
| TW | 201427028 A | | 7/2014 |

OTHER PUBLICATIONS

Search Report appended to an Office Action, which was issued to Taiwanese counterpart application No. 107114433 by the TIPO dated Feb. 23, 2019, with an English translation thereof.

* cited by examiner

PHOTODETECTION FILM, PHOTODETECTION SENSOR AND PHOTODETECTION DISPLAY APPARATUS INCLUDING THE PHOTODETECTION FILM, AND METHOD OF MAKING THE PHOTODETECTION FILM

FIELD

The disclosure relates to a photodetection film, and more particularly to a photodetection film including a light-absorbing semiconductor film, a photodetection sensor and a photodetection display apparatus including the photodetection film, and a method of making the photodetection film.

BACKGROUND

A conventional display apparatus, such as a liquid crystal display (LCD) apparatus or an active matrix organic light emitting display (AMOLED) apparatus, includes a plurality of thin-film transistors (TFTs) and a plurality of pixels that are arranged in an array. Each of the pixels is driven by a respective one of the TFTs for displaying an image. Each of the TFTs is generally a field-effect transistor that includes a semiconductor layer made from a semiconducting material such as amorphous silicon, crystalline silicon, indium gallium zinc oxide (IGZO), a nanocarbon-mixed organic material, and combinations thereof. Since photodiodes may be manufactured using the abovementioned semiconducting material and production equipment of the photodiodes is compatible with production equipment of the TFTs array, a photodetection device, which includes a plurality of the photodiodes and a plurality of the TFTs integrally arranged in an array, is thus produced using the manufacturing procedure of the TFTs array. The photodetection device is utilized in an X-ray flat panel detector disclosed in the Chinese Invention Patent Publication No. CN 103829959 B, and in an X-ray image sensing element and sensing module disclosed in the Chinese Invention Patent Publication No. CN 102903721 B.

In actual use, the photodiode having the TFT structure has photodetection properties as follows. When a gate electrode of the TFT structure is turned off without light illuminating the TFT structure, electric current will not be generated between a source terminal and a drain terminal of the TFT structure by means of an electric potential difference between the source terminal and the drain terminal. However, when the gate electrode of the TFT structure is turned off and the TFT structure is illuminated by the light, which has a photon energy higher than that of a band gap of a semiconductor layer disposed between the gate insulating layer and the drain terminal (or the source terminal), electrons of the semiconductor layer will be excited by the light to generate electron-hole pairs. Separation of the electrons and holes will be driven by the electric potential difference between the source terminal and the drain terminal of the TFT so as to generate a leakage current between the source terminal and the drain terminal. The photodiode of the TFT structure that generates the leakage current can be used as a photodetection sensor in the photodetection field, such as those disclosed in Chinese Invention Patent Publication No. CN 100568072 C and Chinese Invention Patent Publication No CN 105044952 A.

However, photosensitivity and a signal-to-noise ratio of the conventional photodiode of the TFT structure is relatively low and is not well adapted for detecting an environmental light that has a luminance varying in a range of not less than three orders of magnitude change (60 dB), from the smallest value to the largest value. Hence, improvement in the photosensitivity and the signal-to-noise ratio of the conventional thin film transistor is required. In addition, due to limitations of a thickness of the display apparatus and a pixel aperture ratio of the conventional photodetection display apparatus, an image generated from the light detected by the photodiodes is distorted because of optical diffraction. Besides, an incident light has to pass through multiple layers of the conventional photodetection display apparatus before being detected by the photodiodes. Thus, it is difficult to abstract useful optical signals from the environment inside the photodetection display apparatus, where the signal-to-noise ratio is relatively low and electrical signals generated by the photodiodes that is received from the optical signals coexist with sensing signals generated by a touch panel that is received from touching signals. The difficulty in abstracting the useful optical signals is approximately equal to that of single-photon imaging. An original image generated by the electrical signals has to be resolved by reconstruction through an algorithm on the basis of an optic theory. In order to deal with the difficulty of optical-signal abstraction, it is proposed that an optical reinforcing member is disposed in the conventional photodetection display apparatus, or the photodiodes are disposed on a side of a display unit, which is shown by a display module disclosed in Chinese Invention Patent Publication No. 101359369 B, so as to reconstruct the image through a light that is not vertically incident on the side of the display unit. However, inclusion of the optical reinforcing member disadvantageously increases the thickness of the photodetection display apparatus and side-arrangement of the photodiodes on the display unit tends to impede full-screen viewing.

Besides, a p/i/n structure, which has a boron-doped semiconductor layer, may be applied to the TFT structure of the photodiode. However, since boron gas used in the boron-doped semiconductor layer is not environment-friendly, coupled with relatively complicated manufacturing process of the p/i/n structure, increase in the production cost and the environmental protection cost of the photodiode having the p/i/n structure may not be avoided.

SUMMARY

Therefore, an object of the disclosure is to provide a photodetection film that can alleviate at least one of the drawbacks of the prior art.

According one aspect of to the disclosure, a photodetection film includes a photodetection transistor that includes a gate electrode, a gate insulating layer, at least one drain terminal, at least one source terminal, and a light-absorbing semiconductor layer.

The gate insulating layer is surroundingly formed on the gate electrode.

The at least one drain terminal is disposed on the gate insulating layer and is spaced apart from the gate electrode.

The at least one source terminal is disposed on the gate insulating layer and is spaced apart from the gate electrode and the at least one drain terminal.

The light-absorbing semiconductor is disposed on an exposed portion of the gate insulating layer, which is exposed from the at least one drain terminal and the at least one source terminal, and extends between the at least one drain terminal and the at least one source terminal so as to serve as a leakage current channel extending between the at least one drain terminal and the at least one source terminal.

According to another aspect of the disclosure, a photodetection sensor includes at least one pixel sensing portion that includes a thin film transistor for transmitting an electrical signal, and the abovementioned photodetection film that is electrically connected to the thin film transistor.

According to another aspect of the disclosure, a method of making a photodetection sensor adapted to be formed on a substrate provided with a thin film transistor includes:

forming a gate electrode on the substrate using magnetron sputtering techniques;

surroundingly forming a gate insulating layer on the gate electrode using chemical vapor deposition (CVD) techniques or the magnetron sputtering techniques;

forming an n-type semiconductor film on the gate insulating layer using the CVD techniques;

forming a metal film on the n-type semiconductor film using the magnetron sputtering techniques;

patterning the n-type semiconductor film and the metal film to form at least one drain terminal and at least one source terminal which are spaced apart from each other using photolithography and etching techniques so as to expose an exposed portion of the gate insulating layer from the at least one drain terminal and the at least one source terminal; and forming on the exposed portion of the gate insulating layer a light-absorbing semiconductor layer that extends between the at least one drain terminal and the at least one source terminal using the CVD techniques.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
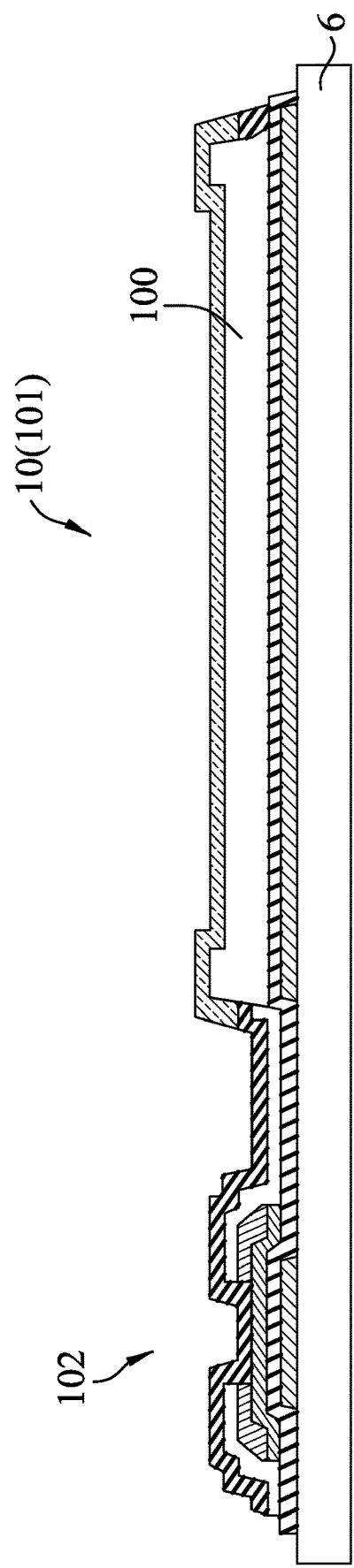
FIG. 1 is schematic view illustrating an embodiment of a photodetection sensor according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a photodetection sensor 10 according to the disclosure is illustrated. The embodiment of the photodetection sensor 10 is formed on a substrate 6 and includes at least one pixel sensing portion 101. The at least one pixel sensing portion 101 includes a thin film transistor 102 for transmitting an electrical signal, and a photodetection film 100 that is electrically connected to the thin film transistor 102.

Figure 2:
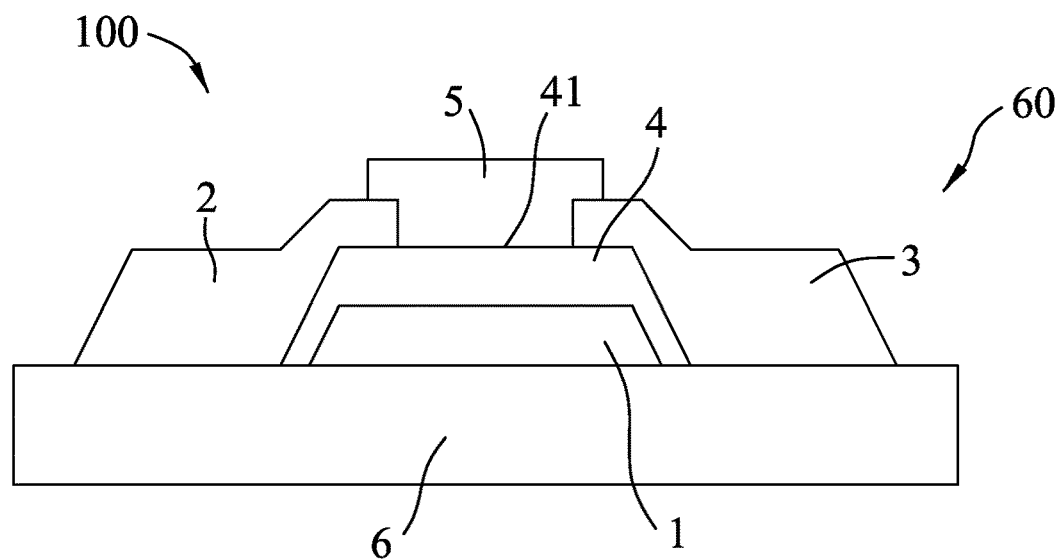
FIG. 2 is a schematic view illustrating a first embodiment of a photodetection film according to the disclosure.
Figure 8:
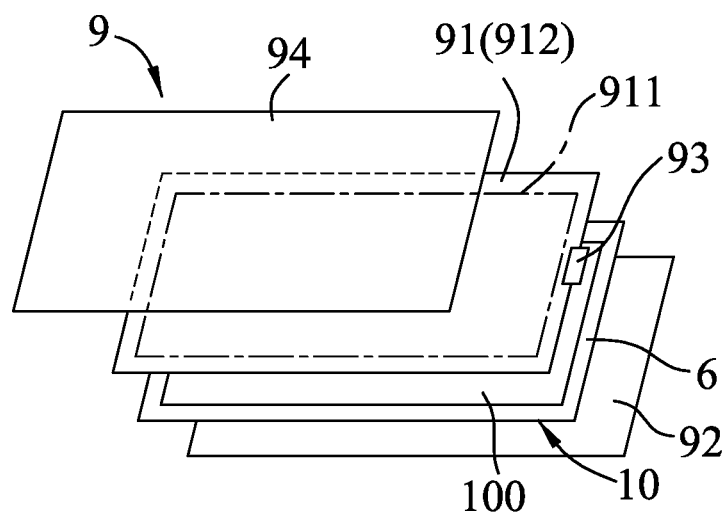
FIG. 8 is a schematic view illustrating another form of the embodiment of the photodetection display apparatus according to the disclosure.

Referring to FIG. 2, a first embodiment of the photodetection film 100 includes a photodetection transistor 60. The disclosure is directed toward improving photosensitivity of the photodetection transistor 60 and in the signal-to-noise ratio, and the photodetection sensor 10 including the photodetection film 100 of the disclosure is suitable for application in high-photosensitivity fields. For example, the photodetection sensor 10 may be disposed under a display member 912 of a display unit 91 of a photodetection display apparatus 9 (as shown in FIG. 8).

The photodetection transistor 60 of the photodetection film 100 includes a gate electrode 1, a gate insulating layer 4, at least one drain terminal 3, at least one source terminal 2 and a light-absorbing semiconductor layer 5. The gate insulating layer 4 is surroundingly formed on the gate electrode 1. The at least one drain terminal 3 is disposed on the gate insulating layer 4 and is spaced apart from the gate electrode 1. The at least one source terminal 2 is disposed on the gate insulating layer 4 and is spaced apart from the gate electrode 1 and the at least one drain terminal 3. The light-absorbing semiconductor layer 5 is disposed on an exposed portion 41 of the gate insulating layer 4 and extends between the at least one drain terminal 3 and the at least one source terminal 2 so as to serve as a leakage current channel extending between the at least one drain terminal 3 and the at least one source terminal 2.

When the gate electrode 1 of the photodetection transistor 60 is turned off without light illuminating the photodetection transistor 60, electric current will not be generated in the leakage current channel between the at least one source terminal 2 and the at least one drain terminal 3 of the photodetection transistor 60, by means of an electric potential difference between the at least one drain terminal 3 and the at least one source terminal 2. However, when the gate electrode 1 of the photodetection transistor 60 is turned off and the light having a photon energy higher than that of a band gap of the light-absorbing semiconductor layer 5 illuminates the photodetection transistor 60 in a direction extending from the light-absorbing semiconductor layer 5 toward the gate electrode 1, a leakage current will be generated in the leakage current channel by means of the electric potential difference between the at least one drain terminal 3 and the at least one source terminal 2. In detail, by way of the light illumination, electrons of light-absorbing semiconductor layer 5 in a ground state are excited to generate electron-hole pairs, and separation of the electron-hole pairs will be driven by the electric field between the at least one source terminal 2 and the at least one drain terminal 3 of the photodetection transistor 60 so as to generate the leakage current. Since the light-absorbing semiconductor layer 5 is disposed to be a topmost and farthest layer of the photodetection transistor 60 relative to the substrate 6, the light can illuminate the light-absorbing semiconductor layer 5 without passing through the gate electrode 1 and the gate insulating layer 4, and thus, excitation of electrons of the light-absorbing semiconductor layer 5 can be enhanced, and photovoltaic conversion efficiency of the photodetection transistor 60 can be improved.

For a conventional thin-film transistor used for driving and transmitting an electrical signal, a structure for collecting the photoelectric current in the semiconductor layer is not required and thus is not considered. In contrast, for the photodetection transistor 60 of the photodetection film 100 of the disclosure, a structure for collecting the photoelectric current, i.e., the light-induced leakage current, is required. In detail, if a drift path of photoelectrons, which are generated by separation of the electron-hole pairs induced in the light-absorbing semiconductor layer 5 and are driven by the electric field between the at least one source terminal 2 and the at least one drain terminal 3, is too long, the excited electrons might have recombine with the holes or captured by dangling bonds present in the light-absorbing semiconductor layer 5 before reaching at the at least one source terminal 2 or the at least one drain terminal 3. Therefore, generation and output of the leakage current of the photodetection film 100 may be deteriorated.

In order to improve the leakage current output, a second embodiment of the photodetection film 100 according to the disclosure is proposed in addition to the abovementioned structure of the first embodiment of the photodetection film 100.

Figure 3:
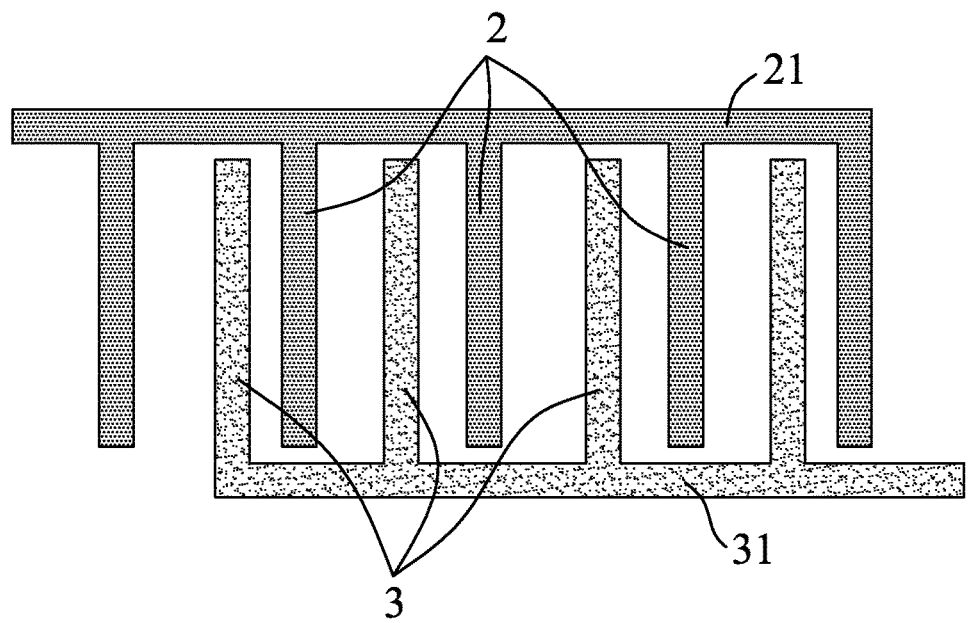
FIG. 3 is a fragmentary and schematically top view illustrating a second embodiment of the photodetection film according to the disclosure.
Figure 4:
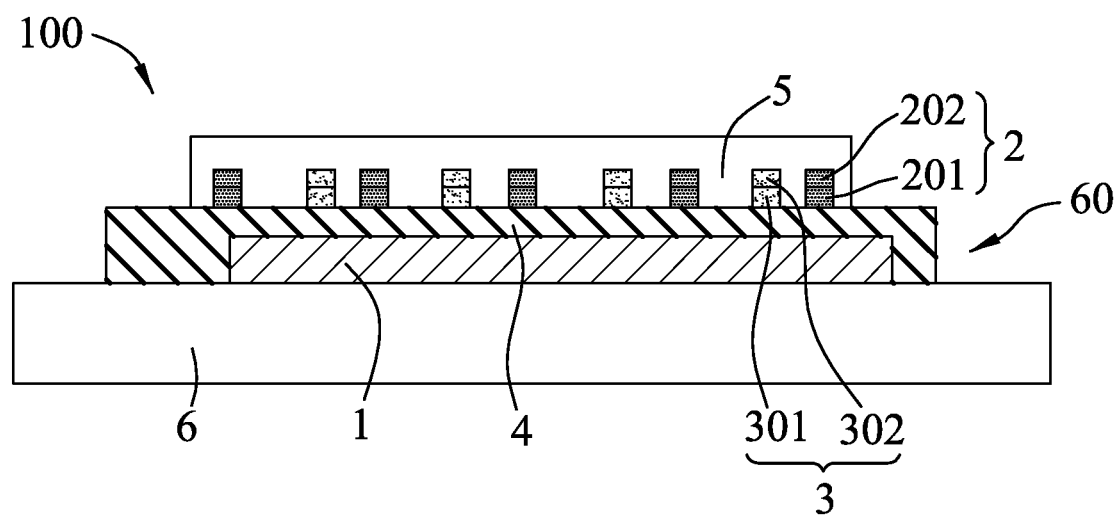
FIG. 4 a schematic view illustrating the second embodiment of the photodetection film according to the disclosure.

Referring to FIGS. 3 and 4, the photodetection transistor 60 of the photodetection film 100 according to the disclosure includes a plurality of the drain terminals 3 that are spaced apart from each other and that are electrically connected in parallel, and a plurality of the source terminals 2 that are spaced apart from each other and that are electrically connected in parallel. The drain terminals 3 and the source terminals 2 are separately and alternately arranged on the gate insulating layer 4. The light-absorbing semiconductor layer 5 disposed on the exposed portion 41 of the gate insulating layer 4 is exposed among the drain terminals 3 and the source terminals 2 and extends among the drain terminals 3 and the source terminals 2. More specifically, each of the drain terminals 3 and source terminals 2 is directly formed on the gate insulating layer 4. The photodetection transistor 60 may further include a drain connecting portion 31 and a source connecting portion 21. Each of the drain terminals 3 is connected to the drain connecting portion 31 so that the drain terminals 3 are electrically connected in parallel. Each of the source terminals 2 is connected to the source connecting portion 21 so that the source terminals 2 are electrically connected in parallel. A distance between one of the source terminals 2 and an adjacent one of the drain terminals 3 is smaller than the drift path of the photoelectrons, which is an average moving distance of the photoelectrons, before the photoelectrons recombine with the holes in the light-absorbing semiconductor layer 5. Therefore, undesired recombination of electron-hole pairs can be alleviated so as to enhance the leakage current generated in the leakage current channel and the photosensitivity of the photodetection film 100.

In one form, the light-absorbing semiconductor layer 5 of the photodetection transistor 60 has an undoped intrinsic amorphous silicon structure that has a crystallinity less than 40% and has a band gap ranging from 1.7 eV to 1.8 eV. The undoped intrinsic amorphous silicon structure is formed by mixing a silane and hydrogen gas, in the absence of any other dopants, using chemical vapor deposition (CVD) techniques. The band gap in electronic volts (eV) is also known as a band width, and refers to an energy difference between a valence band and a conduction band in a band structure. When electrons within a semiconducting material have energy greater than the band gap, the electrons will bound from the valence band to the conduction band gap so as to become free electrons, and thus the semiconducting material will be electrically conductive. The band gap is an important property of the semiconducting material and is determined by a crystal structure and binding properties of atoms, etc. More specifically, the light-absorbing semiconductor layer 5 of the photodetection transistor may have a non-crystalline silicon-germanium structure or a microcrystalline silicon-germanium structure so that the light-absorbing semiconductor layer 5 can absorb the light having a wavelength ranging from the visible light to the infrared light (or near infrared light). Accordingly, the wavelength of the light that the photodetection transistor can detect is expanded from the visible light to the infrared light.

In one form, the light-absorbing semiconductor layer 5 of the photodetection transistor 60 has an undoped intrinsic microcrystalline silicon structure that has a crystallinity greater than 40% and has a band gap less than 1.7 eV.

In one form, the light-absorbing semiconductor layer 5 of the photodetection transistor 60 has a non-crystalline silicon-germanium structure that has a band gap less than 1.7 eV. The non-crystalline silicon-germanium structure is formed by mixing a germane, hydrogen gas and a silane during the CVD. At a room temperature of 300K, the band gap of the germanium is 0.66 eV. The band gap of the light-absorbing semiconductor layer 5 is decreased when the germanium is doped in saline. When the band gap of the light-absorbing semiconductor layer 5 is decreased to be less than 1.7 eV, the light-absorbing semiconductor layer 5 can absorb the light having the wavelength ranging from the visible light to the infrared light (or near infrared light). By controlling the concentration of germane ($GeH_4$) during the CVD, the light-absorbing semiconductor layer 5 having the non-crystalline silicon-germanium structure or the microcrystalline silicon-germanium structure can absorb the light having an expanded wavelength ranging from 600 nm to 1000 nm.

Figure 5:
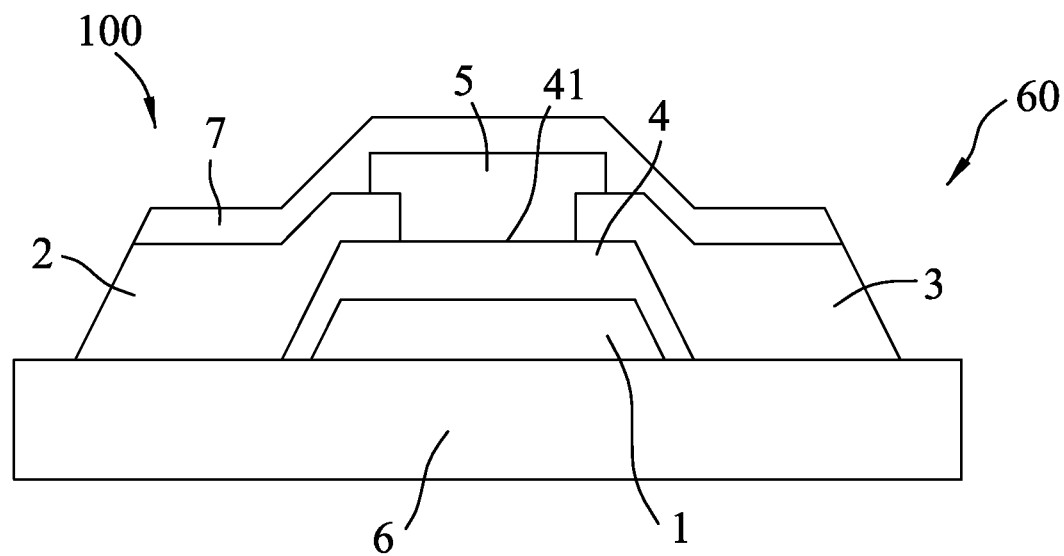
FIG. 5 is a schematic view illustrating another form of the first embodiment of the photodetection film according to the disclosure.
Figure 6:
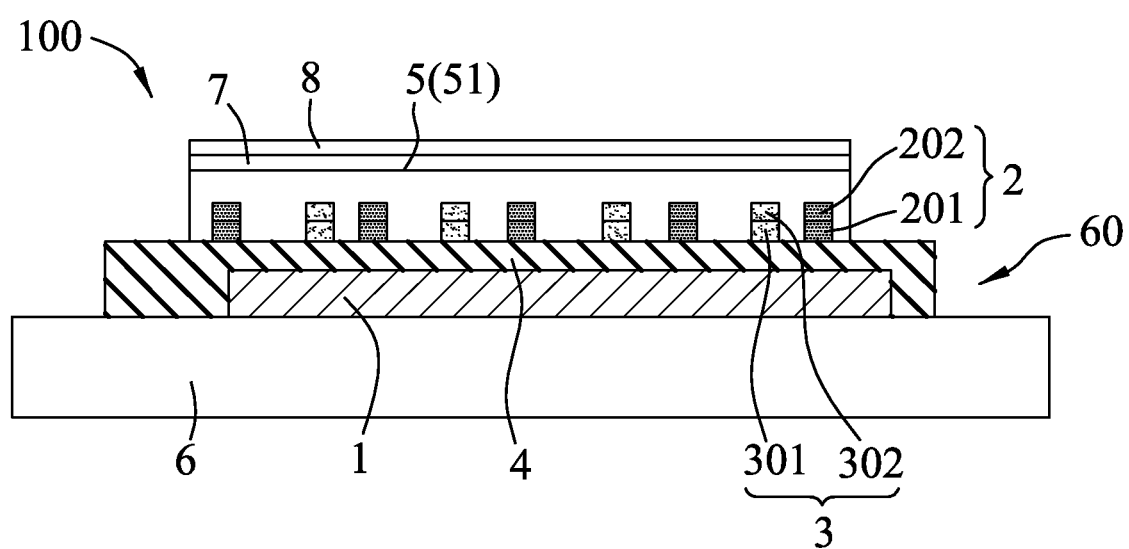
FIG. 6 is a schematic view illustrating another form of the second embodiment of the photodetection film according to the disclosure.

In one form, referring to FIGS. 5 and 6, the at least one drain terminal 3 includes a drain n-type semiconductor layer 301 disposed on the gate insulating layer 4 and a drain electrode 302 disposed on the drain n-type semiconductor layer 301. The at least one source terminal 2 includes a source n-type semiconductor layer 201 disposed on the gate insulating layer 4 and a source electrode 202 disposed on the source n-type semiconductor layer 201. Alternatively, the drain electrode 302 may be disposed between the gate insulating layer 4 and the drain n-type semiconductor layer 301, and the source electrode 202 may be disposed between the gate insulating layer 4 and the source n-type semiconductor layer 201. Each of the drain and source n-type semiconductor layers may be formed by mixing a silane, hydrogen gas and an n-type dopant during the CVD. More specifically, the n-type dopant is phosphane and each of the drain and source n-type semiconductor layers may be heavily doped with phosphane to form a heavily phosphorus-doped drain and source semiconductor layers, respectively. The heavily phosphorus-doped drain and source semiconductor layers have a phosphorus doping concentration that is greater than twice of a conventional n-type semiconductor layer.

In one form, referring back to FIGS. 5 and 6, the photodetection film 100 further includes an insulating protection layer 7 formed on the light-absorbing semiconductor layer 5 of the photodetection transistor 60. The insulating protection layer 7 is made from an electrically insulating material. According to the Chinese national standards GB2900.5, an insulating material is defined as a material used for making a device to be electrically insulating. The insulating material is able to prevent the current from passing therethrough. In actual practice, the insulating protection layer 7 and the gate insulating layer 4 may be made from the identical electrically insulating material or different electrically insulating materials.

In one form, as shown in FIG. 6, the photodetection film 100 may further include an optical film 8 that is immediately disposed on the insulating protection layer 7 for reducing a reflection rate of light from a top surface 51 of the light-absorbing semiconductor layer 5 or reducing a refraction angle of light in the light-absorbing semiconductor layer 5. Since the refraction angle of light in the light-absorbing semiconductor layer 5 is reduced, the light in the light-absorbing semiconductor layer 5 can be as close as possible to a normal line of the light-absorbing semiconductor layer 5 that is perpendicular to the top surface 51. Hence, the light absorbed by the light-absorbing semiconductor layer 5 is increased, and the photoelectric conversion efficiency of the photodetection transistor 60 is improved.

More specifically, the optical film 8 has a structure that is selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically. The optical film 8 has a refractive index smaller than that of the light-absorbing semiconductor layer 5, and thus the light in the light-absorbing semiconductor layer 5 can be as close as possible to the normal line of the light-absorbing semiconductor layer 5 that is perpendicular to the top surface 51.

In one form, the photodetection sensor 10 may include a plurality of the pixel sensing portions 101.

Figure 7:
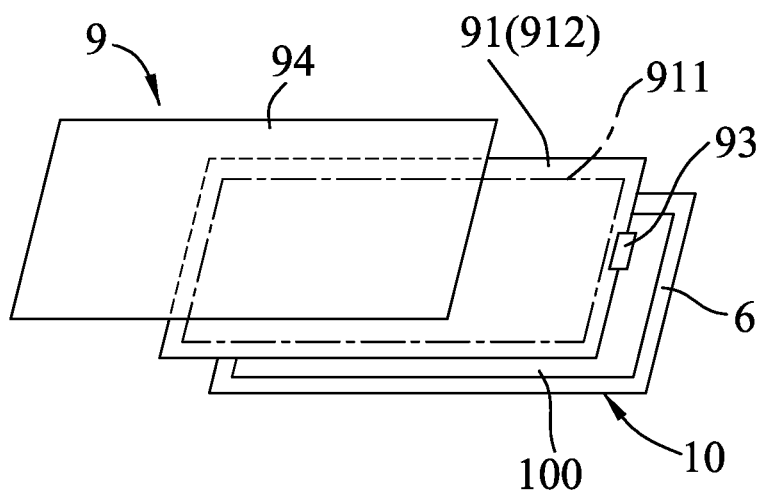
FIG. 7 is a schematic view illustrating an embodiment of the photodetection display apparatus according to the disclosure.

Each of the pixel sensing portions 101 is used for sensing a pixel area. The pixel sensing portions 101 may be arranged in an array, and in actual practice, the photodetection sensor 10 may be disposed under the display member 912 (as shown in FIG. 7). For instance, when the display member 912 has a resolution of 1920×1080, the photodetection sensor 10 may have the pixel sensing portions 101 in an amount of 1920×1080.

Referring to FIG. 7, an embodiment of the photodetection display apparatus 9 according to the disclosure includes the display unit 91 defining a photodetection region 911, at least one of the photodetection sensor 10 disposed under the photodetection region 911, a glass covering plate 94 disposed on the display unit 91 for protecting the display unit 91, and a drive and control circuit unit 93 electrically connected to the display unit 5. The photodetection display apparatus 9 may be an electronic apparatus including a touchable display screen, such as a portable apparatus (e.g. a cell phone, a tablet computer, a personal digital assistant (PDA), etc.), a personal computer, or an industrial computer.

The display unit 91 may include a thin film transistor for driving the display member 912 and transmitting electrical signals. The display member 912 may be selected from an active matrix organic light emitting diode (AMOLED) display device, a liquid crystal display (LCD) device, a micro light emitting diode (LED), a quantum dot display device, and an electronic ink (E-ink) display device.

Referring to FIG. 8, in one form, the display member 912 of the display unit 91 is the LCD device or the E-ink display device, and the photodetection display apparatus 9 may further include a backlight unit 92 that is disposed under the at least one of the photodetection sensor 10 such that the at least one of the photodetection sensor 10 is disposed between the display unit 91 and the backlight unit 92. Since the LCD device or the E-ink display device is not self-luminous, the backlight unit 92 is required to be disposed below the LCD device or the E-ink display device. The backlight unit 92 may be in the form of a LCD backlight module, or other self-luminous electronic devices. Alternatively, when the display member 912 is a self-luminous OLED device (e.g. the AMOLED device), the photodetection display apparatus 9 may be free of the backlight unit 913. By way of the abovementioned alternative forms of the display member 912, application range of the photodetection display apparatus 9 of the disclosure can be expanded.

The drive and control circuit 93 of the photodetection display apparatus 9 is configured to turn on and turn off the at least one photodetection sensor 10 upon receiving turn-on and turn-off signals inputted by a user, respectively.

In one form, the display unit 91 defines a plurality of the photodetection regions 911. The photodetection display apparatus 9 includes a plurality of the photodetection sensors 10, each of which corresponds in position to a respective one of the photodetection regions 911.

When the number of the photodetection regions 911 of the display unit 91 and the number of the photodetection sensors 10 are respectively exemplified to be two, the photodetection regions 911 may be respectively located on top and bottom of the display unit 91, or may be respectively located at left and right sides of the display unit 91. More specifically, each of the photodetection sensors 10 is disposed beneath a respective one of the photodetection regions 911. The photodetection sensors 10 are turned on and turned off by the turn-on and turn-off signals inputted by the user. In one form, the photodetection regions 911 cooperatively cover the entire area of the display member 912, so that all of the light passing through the photodetection regions 911 of the display unit 91 can be absorbed by the photodetection sensors 10. In another form, the image sensors 10 may cover two-thirds or three-fourths of the area of the display member 912. The photodetection sensors 10 may be controlled in such a manner that one of the photodetection sensors 10 is turned on and the other one of the photodetection sensors 10 is turned off.

In one form, the number of the photodetection regions 911 may be more than two and may be varied based on actual use, and the turn-on or turn-off states of the photodetection sensors 10 may be separately controlled by the user.

Figure 9:
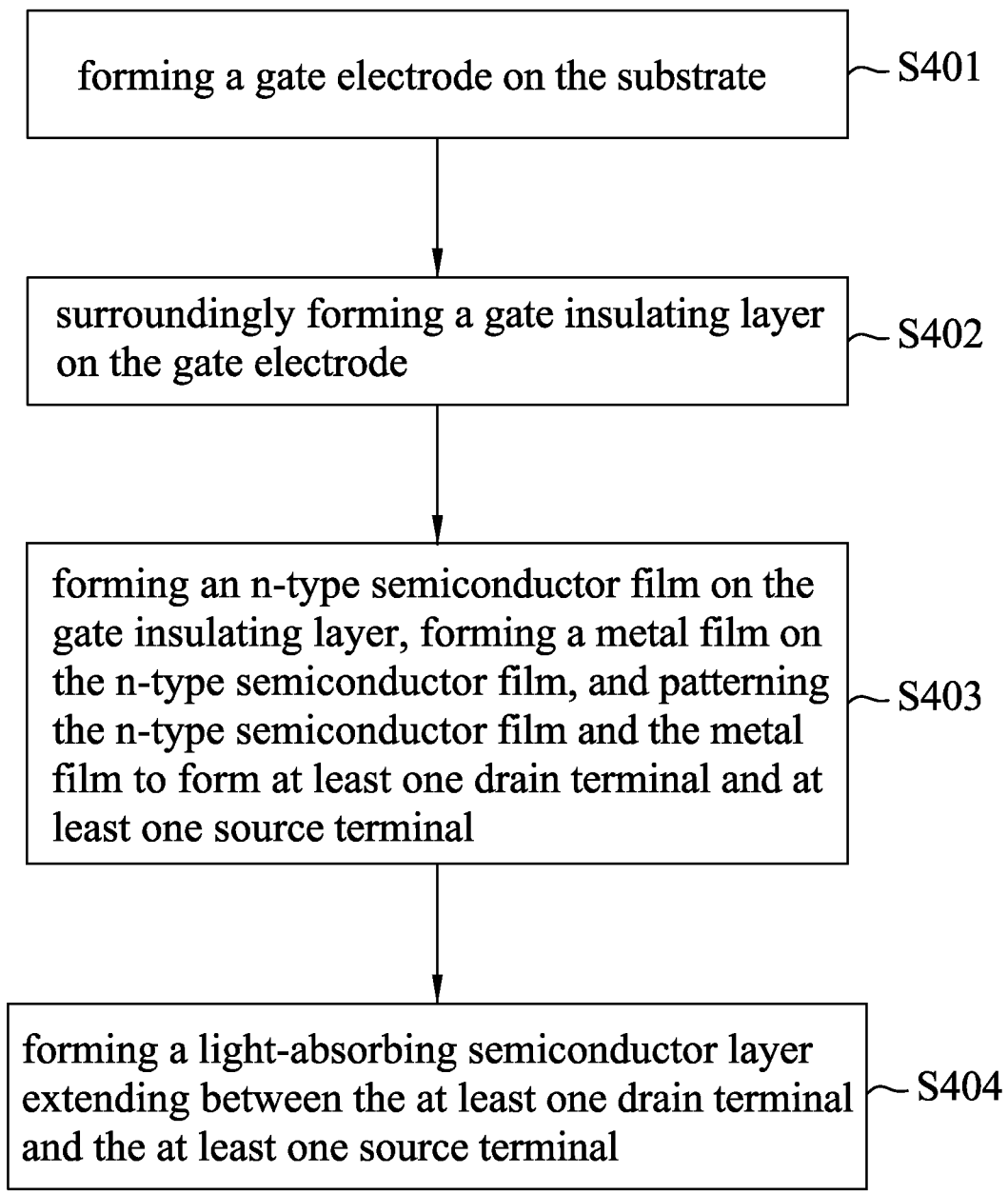
FIG. 9 is a flow chart of a first embodiment of a method of making a photodetection film according to the disclosure.
Figure 10:
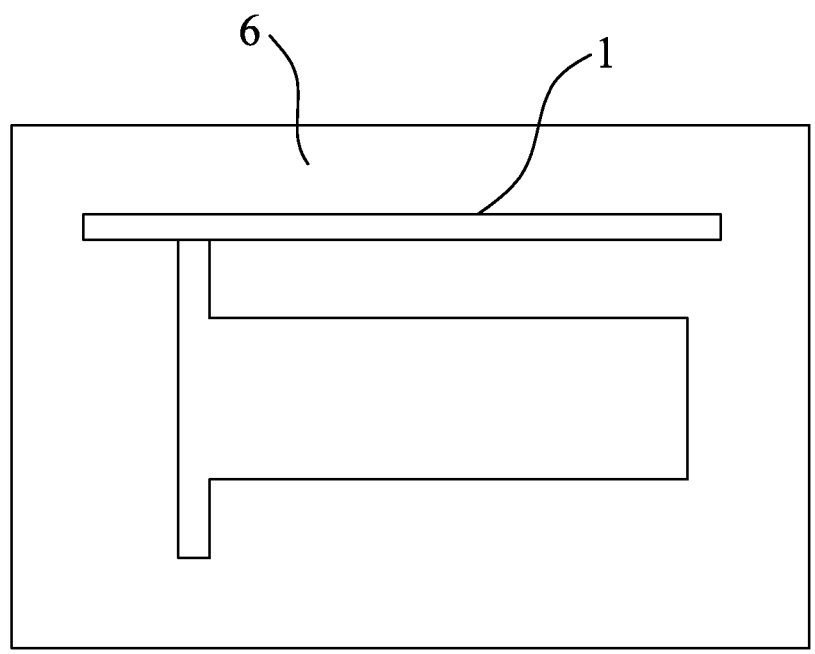
FIGS. 10 to 17 are schematic views illustrating consecutive steps of a second embodiment of a method of making a photodetection film according to the disclosure.
Figure 11:
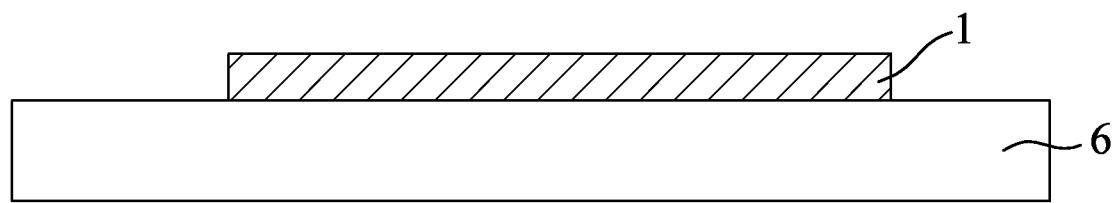
Figure 12:
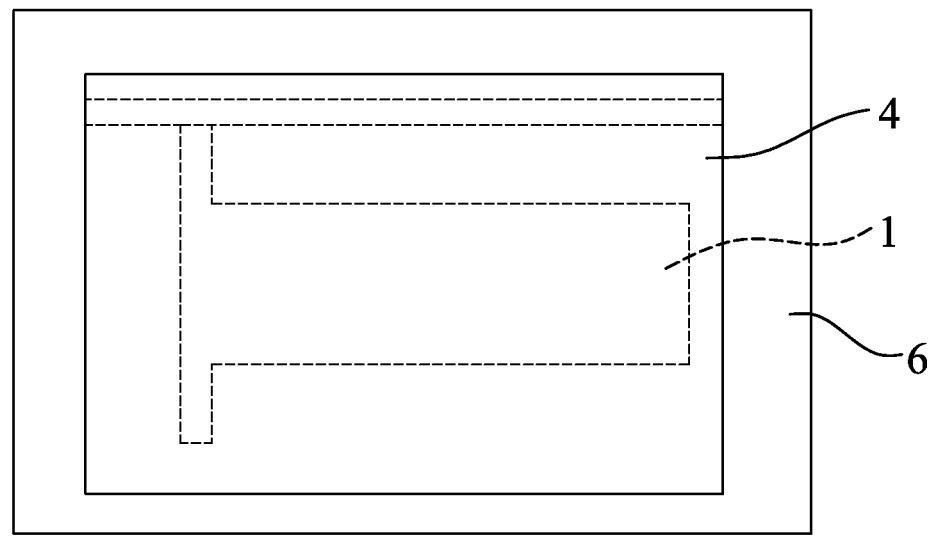
Figure 13:
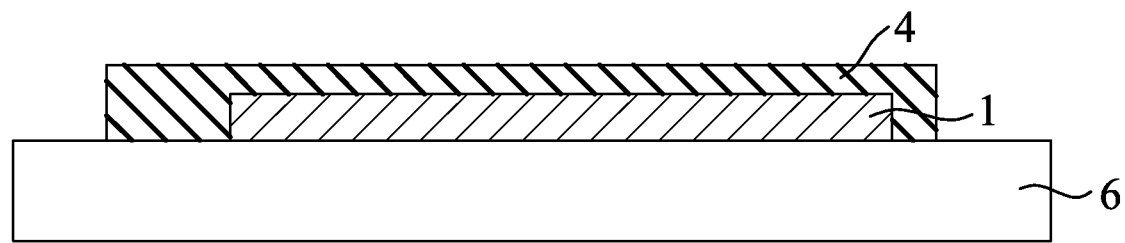
Figure 14:
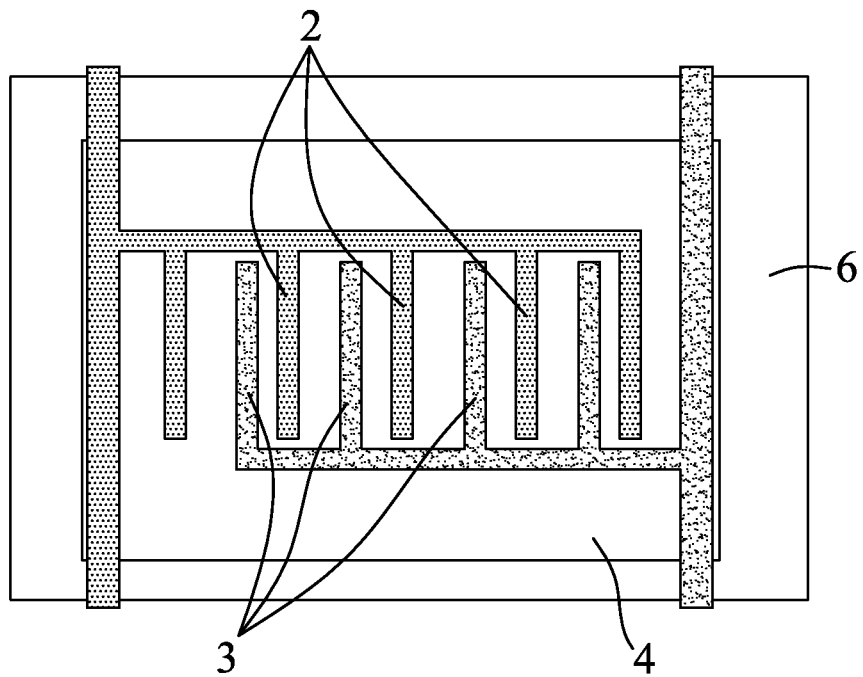
Figure 15:
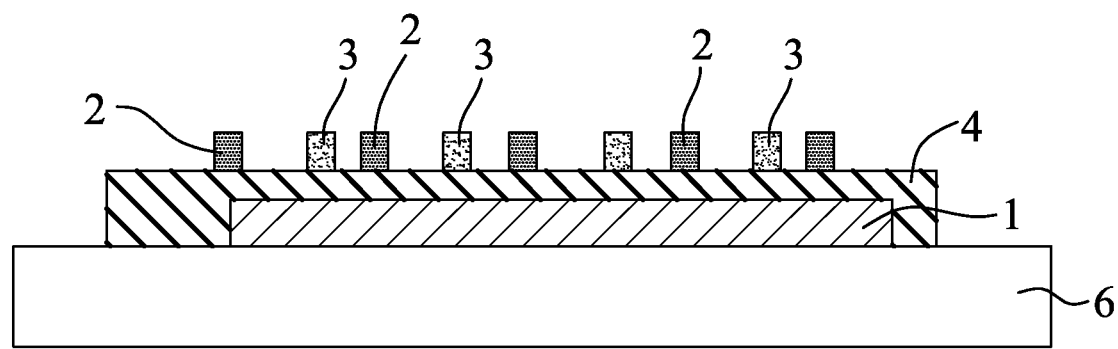
Figure 16:
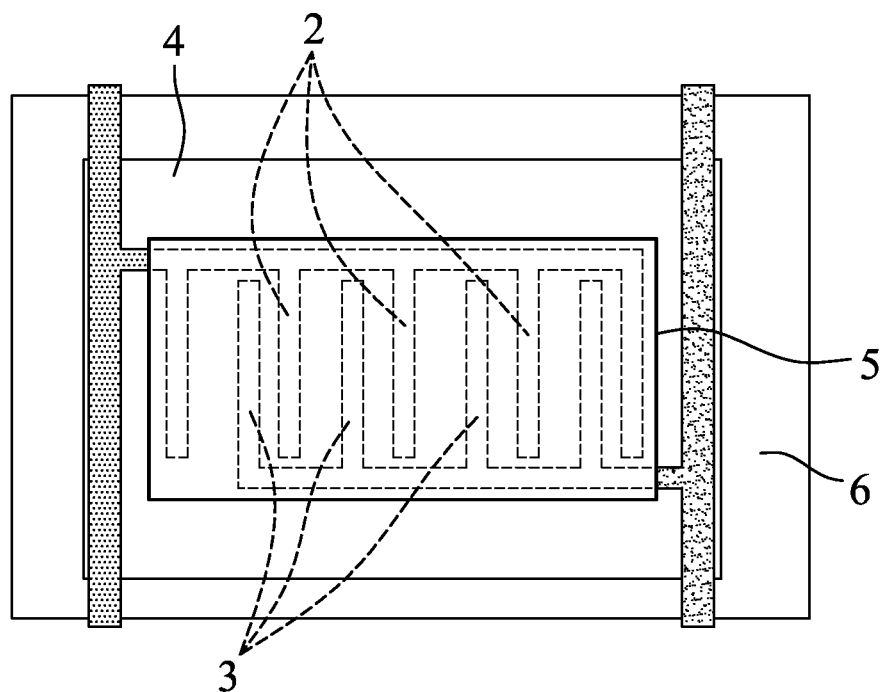
Figure 17:
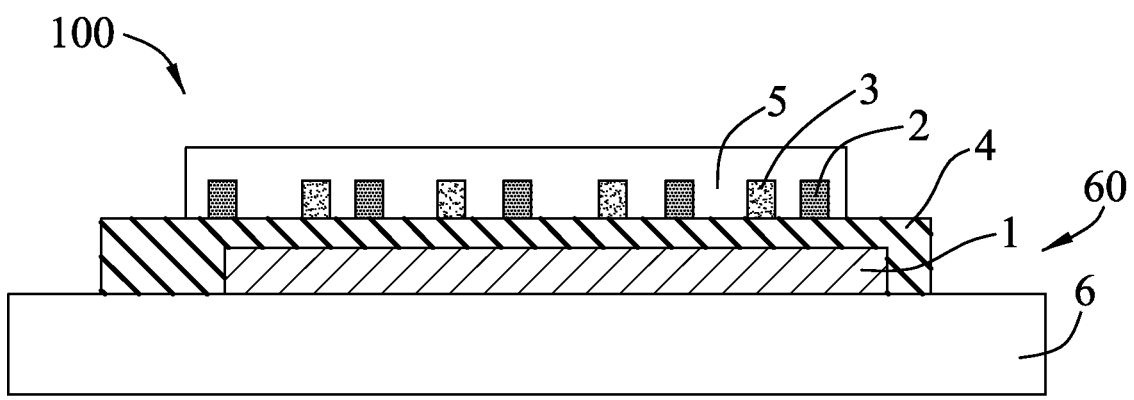

Referring to FIG. 9, a first embodiment of a method of making a photodetection film that is adapted to be formed on the substrate 6 provided with the thin film transistor 102 is illustrated. In this embodiment, the photodetection film to be made is the photodetection film 10 as shown in FIG. 2. The embodiment of the method includes Steps S401 to S404.

In Step S401, the gate electrode 1 is formed on the substrate 6 using magnetron sputtering techniques. The substrate 6 may be made of an inflexible material or a flexible material, such as polyimide.

Step S402 is conducted after Step S401. In Step S402, a gate insulating layer 4 is surroundingly formed on the gate electrode 1 using the CVD techniques or the magnetron sputtering techniques.

Step S403 is conducted after Step S403. In Step S403, an n-type semiconductor film is formed on the gate insulating layer using the CVD techniques, a metal film is formed on the n-type semiconductor film using the magnetron sputtering techniques, and the n-type semiconductor film and the metal film are patterned to form the at least one drain terminal 3 and the at least one source terminal 2, which are spaced apart from each other, using photolithography and etching techniques. By way of Step S403, an exposed portion 41 of the gate insulating layer 4, which is exposed from the at least one drain terminal 3 and the at least one source terminal 2, is formed.

Step S404 is conducted after Step S403. In Step S404, the light-absorbing semiconductor layer 5 that extends between the at least one drain terminal 3 and the at least one source terminal 2 is formed on the exposed portion 41 of the gate insulating layer 4 using the CVD techniques.

Referring to FIGS. 10 to 17, a second embodiment of a method of making a photodetection film of the disclosure is illustrated. In this embodiment, the photodetection film to be formed is the photodetection film 100 as shown in FIGS. 3 and 4. In Step S403, the patterning of the n-type semiconductor film (not shown) and the metal film (not shown) includes forming the drain terminals 3 that are spaced apart from each other and that are electrically connected in parallel, and the source terminals 2 that are spaced apart from each other and that are electrically connected in parallel, such that the drain terminals 3 and the source terminals 2 are spaced apart from one another and alternately arranged on the gate insulating layer 4.

In one form, the light-absorbing semiconductor layer 5 has the intrinsic amorphous silicon structure that is formed by mixing a silane and hydrogen gas during the CVD, such that the intrinsic amorphous silicon structure has a crystallinity less than 40% and has a band gap ranging from 1.7 eV to 1.8 eV.

In one form, the light-absorbing semiconductor layer 5 has an intrinsic microcrystalline silicon structure that is formed by mixing a silane and hydrogen gas during the CVD, such that the intrinsic microcrystalline silicon structure has a crystallinity greater than 40% and has a band gap less than 1.7 eV.

In one form, the light-absorbing semiconductor layer 5 has a noncrystalline silicon-germanium structure that is formed by mixing a germane, hydrogen gas and a silane during the CVD, such that the noncrystalline silicon-germanium structure has a band gap of less than 1.7 eV.

In one form, Step S403 of the first and second embodiments of the method of making the photodetection film of the disclosure may be conducted by forming the metal film on the gate insulating layer 4 using the magnetron sputtering techniques, forming the n-type semiconductor film on the metal film using the CVD techniques, and then patterning the n-type semiconductor film and the metal film to form the at least one drain terminal 3 and the at least one source terminal 2 which are spaced apart from each other using the photolithography techniques and the etching techniques. In the embodiment, forming of the n-type semiconductor film includes mixing a silane, phosphine and hydrogen gas during the CVD.

In one form, the first and second embodiments of the method of making the photodetection film of the disclosure may further include forming the insulating protection layer 7 on the top surface 51 of the light-absorbing semiconductor layer 5 using the CVD techniques.

In one form, the first and second embodiments of the method of making the photodetection film of the disclosure may further include forming the optical film 8 (as shown in FIG. 6) on the insulating protection layer 7 for reducing a reflection rate of light from the top surface 51 of the light-absorbing semiconductor layer or reducing a refraction angle of light in the light-absorbing semiconductor layer 5.

The optical film 8 is made from an oxygen-containing compound or a nitrogen-containing compound and is formed using the CVD techniques or the sputtering techniques. The oxygen-containing compound may be selected from a group consisting of silicon oxide having a formula of $SiO_x$ with x being not less than 1, niobium pentaoxide ($Nb_5O_5$), zinc oxide (ZnO), indium tin oxide (ITO), and titanium dioxide ($TiO_2$). The nitrogen-containing compound may have a formula of $SiN_y$, with y being not less than 1.

By virtue of the arrangement of the photodetection sensor 10 including the photodetection film 100, the photodetection transistor 60 is an inverted-coplanar structure relative to the substrate 6 with the gate electrode 1 being proximal to the substrate 6, and the light-absorbing semiconductor layer 5 being distant from the substrate 6. Bottom surfaces of the at least one source terminal 2 and the at least one drain terminal 3 that are proximal to the substrate 6 are coplanar.

Furthermore, by virtue of the arrangement of the photodetection film 100, since the light-absorbing semiconductor layer 5 is the topmost and farthest portion of the photodetection film 100 relative to the substrate 6, the light can illuminate the light-absorbing semiconductor layer 5 directly without passing through other components of the photodetection film 101, i.e., the gate electrode 1 and the gate insulating layer 4. Hence, the photoelectrons generated in the light-absorbing semiconductor layer 5, which are excited from the ground state to the excited state, are increased. Furthermore, in the pixel sensing portion 101 of the photodetection sensor 10, the drain terminals 3 are electrically connected in parallel and the source terminals 2 are electrically connected in parallel. Therefore, when a predetermined electrical potential difference is applied between the drain terminals 3 and the source terminals 2, the photoelectrons collected by the drain terminals 3 (or the source terminals 2) are increased and the recombination of the excited electrons and the holes is reduced, and thus improvements in the photosensitivity of the photodetection film 101 is achieved. Moreover, since the light-absorbing semiconductor layer 5 of the photodetection film 100 of the disclosure is not doped with a boron gas, boron pollution can be avoided during the manufacturing of the photodetection film 100.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A photodetection display apparatus, comprising:
a display unit defining a photodetection region; and
at least one photodetection sensor disposed below said photodetection region,
wherein said at least one photodetection sensor includes at least one pixel sensing portion which includes a thin film transistor for transmitting an electrical signal, and a photodetection film that is electrically connected to said thin film transistor,
wherein said photodetection film includes a photodetection transistor which includes
a gate electrode;
a gate insulating layer that is surroundingly formed on said gate electrode;
at least one drain terminal that is disposed on said gate insulating layer and that is spaced apart from said gate electrode;
at least one source terminal that is disposed on said gate insulating layer and that is spaced apart from said gate electrode and said at least one drain terminal; and
a light-absorbing semiconductor layer that is disposed on an exposed portion of said gate insulating layer exposed from said at least one drain terminal and said at least one source terminal and that extends between said at least one drain terminal and said at least one source terminal so as to serve as a leakage current channel between said at least one drain terminal and said at least one source terminal.

2. The photodetection display apparatus of claim 1, wherein said display unit includes a display member selected from an active matrix organic light emitting diode (AMOLED) display device, a liquid crystal display (LCD) device, a micro light emitting diode (LED), a quantum dot display device, and an electronic ink (E-ink) display device.

3. The photodetection display apparatus of claim 2, wherein said display member of said display unit is the LCD device or the E-ink display device said photodetection display apparatus further comprising a backlight unit that is disposed below said at least one photodetection sensor such that said at least one photodetection sensor is disposed between said display unit and said backlight unit.

4. The photodetection display apparatus of claim 1, wherein said display unit defines a plurality of said photodetection regions, said photodetection display apparatus comprising a plurality of said photodetection sensors, each of which corresponds in position to a respective one of said photodetection regions.

5. The photodetection display apparatus of claim 1, further comprising a drive and control circuit unit configured to turn on and turn off said at least one photodetection sensor upon receiving turn-on and turn-off signals inputted by a user, respectively.

6. A method of making a photodetection sensor, comprising the following steps:
(a) providing a substrate with a thin film transistor;
(b) forming a gate electrode on the substrate by magnetron sputtering;
(c) surroundingly forming a gate insulating layer on the gate electrode by chemical vapor deposition (CVD) or magnetron sputtering;
(d) forming an n-type semiconductor film on the gate insulating layer by CVD;
(e) forming a metal film on the n-type semiconductor film by magnetron sputtering;
(f) patterning the n-type semiconductor film and the metal film to form at least one drain terminal and at least one source terminal which are spaced apart from each other by photolithography and etching so as to expose an exposed portion of the gate insulating layer from the at least one drain terminal and the at least one source terminal; and
(g) forming on the exposed portion of the gate insulating layer a light-absorbing semiconductor layer that extends between the at least one drain terminal and the at least one source terminal by CVD.

7. The method of claim 6, wherein patterning of the n-type semiconductor film and the metal film in step (f) includes forming a plurality of the drain terminals that are spaced apart from each other and that are electrically connected in parallel, and a plurality of source terminals that are spaced apart from each other and that are electrically connected in parallel, such that the drain terminals and the source terminals are spaced apart from one another and alternately arranged on the gate insulating layer.

8. The method of claim 6, wherein in step (g), the light-absorbing semiconductor layer has an intrinsic amorphous silicon structure formed by mixing a silane and hydrogen gas by CVD, such that the intrinsic amorphous silicon structure has a crystallinity less than 40% and has a band gap ranging from 1.7 eV to 1.8 eV.

9. The method of claim 6, wherein in step (g), the light-absorbing semiconductor layer of has an intrinsic microcrystalline silicon structure formed by mixing a silane and hydrogen gas by CVD, such that the intrinsic microcrystalline silicon structure has a crystallinity greater than 40% and has a band gap less than 1.7 eV.

10. The method of claim 6, wherein in step (g), the light-absorbing semiconductor layer has a non-crystalline silicon-germanium structure formed by mixing a germane, hydrogen gas and a silane by CVD, such that the non-crystalline silicon-germanium structure has a band gap less than 1.7 eV.

11. The method of claim 6, wherein forming of the n-type semiconductor film in step (d) includes mixing a silane, phosphine and hydrogen gas by CVD.

12. The method of claim 6, further comprising forming an insulating protection layer on a top surface of the light-absorbing semiconductor layer by CVD.

13. The method of claim 12, further comprising forming on the insulating protection layer an optical film for reducing a reflection rate of light from said top surface of the light-absorbing semiconductor layer or reducing a refraction angle of light in the light-absorbing semiconductor layer.

14. The method of claim 13, wherein the optical film is selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically, the optical film having a refractive index smaller than that of the light-absorbing semiconductor layer.

15. The method of claim 14, wherein the optical film is made from one of an oxygen-containing compound and a nitrogen-containing compound by CVD or by sputtering.

16. The method of claim 15, wherein the oxygen-containing compound is selected from a group consisting of silicon oxide having a formula of $SiO_x$ with x being not less than 1, niobium pentaoxide ($Nb_2O_5$), zinc oxide (ZnO), indium tin oxide (ITO), titanium dioxide ($TiO_2$); and wherein the nitrogen-containing compound has a formula of $SiN_y$ with y being not less than 1.

17. The photodetection display apparatus of claim 1, wherein said photodetection transistor includes a plurality of said drain terminals that are spaced apart from each other and that are electrically connected in parallel and a plurality of said source terminals that are spaced apart from each other and that are electrically connected in parallel, said drain terminals and said source terminals being separately and alternately arranged on said gate insulating layer, said light-absorbing semiconductor layer disposed on the exposed portion of said gate insulating layer exposed among said drain terminals and said source terminals and extending among said drain terminals and said source terminals.

18. The photodetection display apparatus of claim 1, wherein said light-absorbing semiconductor layer of said photodetection transistor has an undoped intrinsic amorphous silicon structure that has a crystallinity less than 40% and has a band gap ranging from 1.7 eV to 1.8 eV.

19. The photodetection display apparatus of claim 1, wherein said light-absorbing semiconductor layer of said photodetection transistor has an undoped intrinsic microcrystalline silicon structure that has a crystallinity greater than 40% and has a band gap less than 1.7 eV.

20. The photodetection display apparatus of claim 1, wherein said light-absorbing semiconductor layer of said photodetection transistor has a non-crystalline silicon-germanium structure that has a band gap less than 1.7 eV.

21. The photodetection display apparatus of claim 1, wherein said at least one drain terminal includes a drain n-type semiconductor layer disposed on said gate insulating layer and a drain electrode disposed on said drain n-type semiconductor layer, said at least one source terminal including a source n-type semiconductor layer disposed on said gate insulating layer and a source electrode disposed on said source n-type semiconductor layer.

22. The photodetection display apparatus of claim 1, wherein said photodetection film further includes an insulating protection layer formed on said light-absorbing semiconductor layer of said photodetection transistor.

23. The photodetection display apparatus of claim 22, wherein said photodetection film further includes an optical film that is immediately disposed on said insulating protection layer for reducing a reflection rate of light from a top surface of said light-absorbing semiconductor layer or reducing a refraction angle of light in said light-absorbing semiconductor layer.

24. The photodetection display apparatus of claim 23, wherein said optical film has a structure selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically, said optical film having a refractive index smaller than that of said light-absorbing semiconductor layer.

25. The photodetection display apparatus of claim 23, wherein said optical film is made from an oxygen-containing compound or a nitrogen-containing compound.

26. The photodetection display apparatus of claim 25, wherein the oxygen-containing compound is selected from a group consisting of silicon oxide having a formula of SiOx with x being not less than 1, niobium pentaoxide (Nb2O5), zinc oxide (ZnO), indium tin oxide (ITO), and titanium dioxide (TiO2); and wherein the nitrogen-containing compound has a formula of SiNy with y being not less than 1.

* * * * *